(12) United States Patent
Liao

(10) Patent No.: US 6,365,488 B1
(45) Date of Patent: Apr. 2, 2002

(54) METHOD OF MANUFACTURING SOI WAFER WITH BURIED LAYER

(75) Inventor: Chungpin Liao, Taichung (TW)

(73) Assignee: Industrial Technology Research Institute, Hsin-Chu (TW)

( * ) Notice: Subject to any disclaimer, the term of this patent is extended or adjusted under 35 U.S.C. 154(b) by 0 days.

(21) Appl. No.: 09/035,057

(22) Filed: Mar. 5, 1998

(51) Int. Cl.⁷ .............................................. H01L 21/762
(52) U.S. Cl. ...................................................... 438/406
(58) Field of Search .................. 438/406, 455, 438/456, 458, 459, FOR 222, FOR 105; 148/DIG. 12

(56) References Cited

U.S. PATENT DOCUMENTS

| | | | |
|---|---|---|---|
| 4,772,571 A | * | 9/1988 | Scovell et al. |
| 5,374,564 A | * | 12/1994 | Bruel |
| 5,591,678 A | * | 1/1997 | Bendik et al. |
| 5,618,739 A | * | 4/1997 | Takahashi et al. |
| 5,807,783 A | * | 9/1998 | Gaul et al. |
| 5,851,894 A | * | 12/1998 | Ramm |
| 5,863,832 A | * | 1/1999 | Doyle et al. |
| 5,904,495 A | * | 5/1999 | Burke et al. |
| 6,030,865 A | * | 2/2000 | Hashimoto et al. |

OTHER PUBLICATIONS

S. Wolf "Silicon Processing For The VLSI Era" vol. 2, Lattice Press, Sunset Beach, CA, 1990, pp. 66–78.

M. Bruel, "Silicon on Insulator Material Technology", Electronics Letters, vol. 31, No. 14, Jul. 6 1995, pp. 1201–1202.

M. Bruel, "SMARTCUT: A Promising New SOI Material Technology" Proceedings 1995 IEEE International SOI Conf. Oct. 1995, pp. 178–179.

H. Moriceau et al., "Cleaning and Polishing as Key Steps for SMART–CUT SOI Process", Proceedings 1996 IEEE International SOI Conference, Oct. 1996, pp. 152–153.

* cited by examiner

Primary Examiner—George Fourson
(74) Attorney, Agent, or Firm—George O. Saile; Stephen B. Ackerman; Rosemary L. S. Pike

(57) ABSTRACT

A method of forming a silicon-on-insulator device having a buried layer is described. Ions are implanted into a first semiconductor substrate where it is not covered by a photoresist mask to form implanted regions. Alternatively, a silicide layer over the first semiconductor substrate is patterned to leave silicide regions. A first oxide layer is formed overlying the first semiconductor substrate whereby the implanted regions or the silicide regions form the buried layer structure. A second oxide layer is formed overlying a second semiconductor substrate. The first and second oxide layers are bonded together to form the wafer, using either the bond and etch back or the Unibond™ method to complete formation of an silicon-on-insulator wafer having a buried layer structure in the fabrication of an integrated circuit.

28 Claims, 8 Drawing Sheets

METHOD OF MANUFACTURING SOI WAFER WITH BURIED LAYER

BACKGROUND OF THE INVENTION (1) Field of the Invention

The invention relates to the fabrication of integrated circuit devices, and more particularly, to a method of forming a silicon-on-insulator (SOI) device having a buried layer in the fabrication of integrated circuits.

(2) Description of the Prior Art

As 3C (computer, communication, and consumer) integration becomes a worldwide trend, Bipolar Junction Transistor (BJT) devices are coming into high demand. Because of their good device isolation properties and resulting superb device performance characteristics, silicon-on-insulator (SOI) wafers are becoming more and more popular. Silicon-on-insulator technology is discussed in *Silicon Processing for the VLSI Era—Volume II,* by Stanley Wolf, Lattice Press, Sunset Beach, Calif., c. 1990, on pages 66–78. Two of the many methods of making SOI wafers will be described with reference to FIGS. 1A, 1B, 2A, 2B, and 2C.

Referring now more particularly to FIG. 1A, there is shown a semiconductor substrate 1, preferably composed of monocrystalline silicon. A layer of silicon oxide 2 is formed on the surface of the substrate. A second monocrystalline substrate 3 has a silicon oxide layer 4 formed thereon. The first substrate 1 is turned upside down and the two substrates are joined together at the surface of their oxide layers by pressurizing and strengthening during later annealing. The substrate 1 is etched back or polished to reduce its thickness, as shown in FIG. 1B. This method can be referred to as the bonded and etched back SOI (BESOI).

A second method is known as the Unibond™ method. The SMART-CUT Unibond™ method is discussed in the three papers, "Silicon on Insulator Material Technology," by M. Bruel, *Electronics Letters, Vol.* 31, No. 14, Jul. 6, 1995, pp. 1201–1202, "'SMART CUT': A Promising New SOI Material Technology," by M. Bruel et al, *Proceedings* 1995 *IEEE International SOI Conference*, October 1995, pp. 178–179, and "Cleaning and Polishing as Key Steps for SMART-CUT SOI Process," by H. Moriceau et al, *Proceedings* 1996 *IEEE International SOI Conference*, October 1996, pp. 152–153. Referring now to FIG. 2A, there is shown a monocrystalline silicon semiconductor substrate 1. An oxide layer 2 is grown on the surface of the substrate 1. Hydrogen ions are implanted into the wafer to a level 5 where splitting is designed to take place. Referring to FIG. 2B, a second monocrystalline substrate 3 has a silicon oxide layer 4 formed thereon. The first substrate 1 is turned upside down and the two substrates are joined together at the surface of their oxide layers by pressurizing and strengthening during later annealing. During a heat treatment at 400–600° C., the wafer 1 will split at the level of the hydrogen ion penetration 5, leaving behind a thin layer of silicon 6, as shown in FIG. 2C. The substrate 1 that has been split off is re-usable.

In order to make BJT and BICMOS integrated circuit devices of high performance using SOI wafers, it is necessary to make SOI wafers having a buried layer structure within. U.S. Pat. No. 5,488,012 to McCarthy teaches a method of growing a sequence of single or multiple etch stop layers ending with a thin silicon layer on a silicon substrate. The silicon layer is bonded to a glass substrate and the silicon substrate is removed. U.S. Pat. No. 5,286,670 to Kang et al shows a method of forming a semiconductor device having electrical elements buried within a SOI substrate. A layer of polysilicon covers the buried electrical elements and is polished before being bonded to a semiconductor substrate. U.S. Pat. No. 5,360,752 to Brady et al teaches a method of radiation hardening the buried oxide in a SOI structure by implanting ions into the oxide layer.

SUMMARY OF THE INVENTION

A principal object of the present invention is to provide an effective and very manufacturable method of forming a silicon-on-insulator device having a buried layer in the fabrication of an integrated circuit.

Another object of the present invention is to provide a method of forming a silicon-on-insulator device having a buried layer formed by ion implantation in the fabrication of an integrated circuit.

Yet another object of the present invention is to provide a method of forming a silicon-on-insulator device having a buried layer formed by silicide in the fabrication of an integrated circuit.

A further object of the invention is to provide a method of forming a bonded and etched back silicon-on-insulator device (BESOI) having a buried layer in the fabrication of an integrated circuit.

A still further object of the invention is to provide a method of forming a Unibond™ silicon-on-insulator device having a buried layer in the fabrication of an integrated circuit.

In accordance with the objects of this invention the method of forming a silicon-on-insulator device having a buried layer is achieved. Ions are implanted into a first semiconductor substrate where it is not covered by a photoresist mask to form implanted regions. Alternatively, a silicide layer over the first semiconductor substrate is patterned to leave silicide regions. A first oxide layer is formed overlying the first semiconductor substrate whereby the implanted regions or the silicide regions form the buried layer structure. A second oxide layer is formed overlying a second semiconductor substrate. The first and second oxide layers are bonded together to form the wafer, using either the bond and etch back or the Unibond™ method to complete formation of an silicon-on-insulator wafer having a buried layer structure in the fabrication of an integrated circuit.

BRIEF DESCRIPTION OF THE DRAWINGS

In the accompanying drawings forming a material part of this description, there is shown.

DESCRIPTION OF THE PREFERRED EMBODIMENTS

The process of the present invention can be used to form a silicon-on-insulator device having a buried layer wherein the device is formed by a bonding and etch back method or by a Unibond™ method.

Figure 1A:
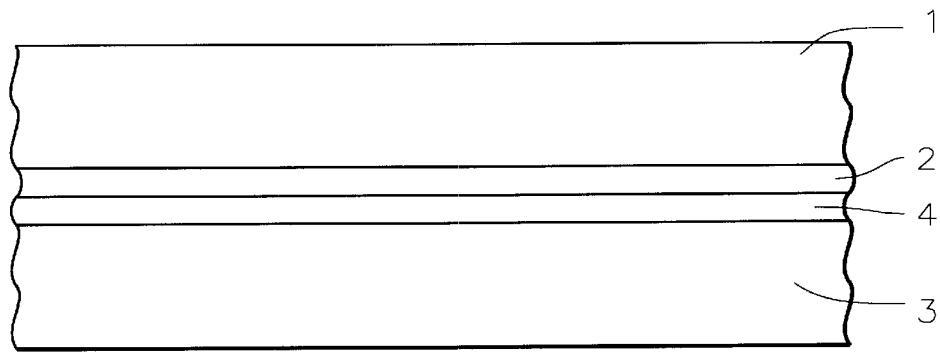
FIGS. 1A and 1B schematically illustrate in cross-sectional representation a first silicon-on-insulator device of the prior art.
Figure 1B:
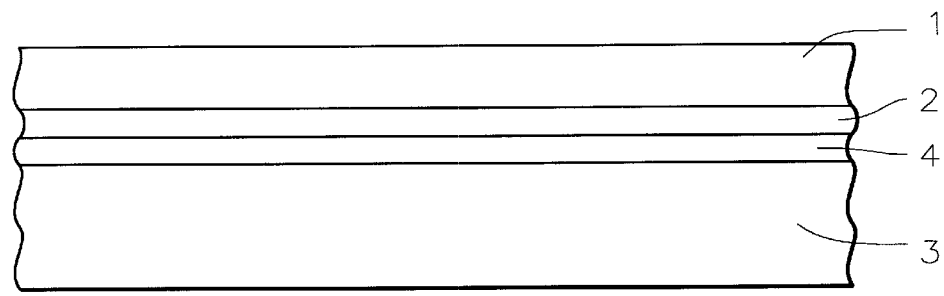
Figure 2A:
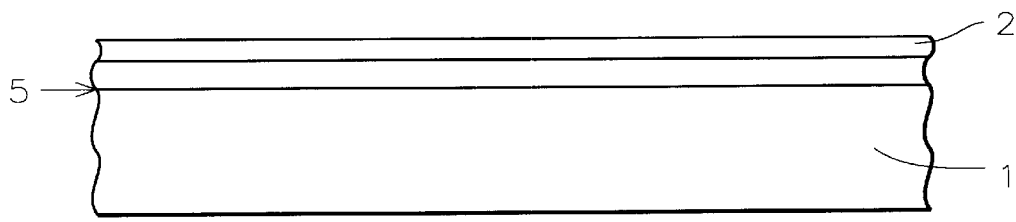
FIGS. 2A, 2B, and 2C schematically illustrate in cross-sectional representation a second silicon-on-insulator device of the prior art.
Figure 2B:
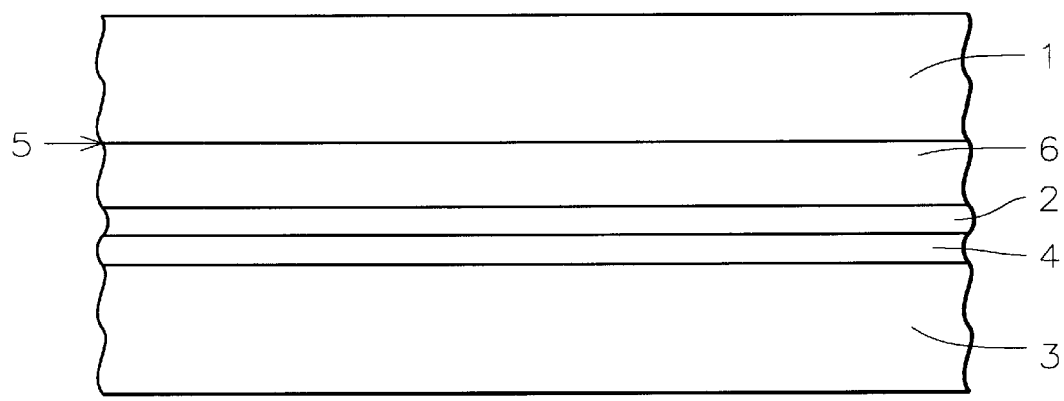
Figure 2C:
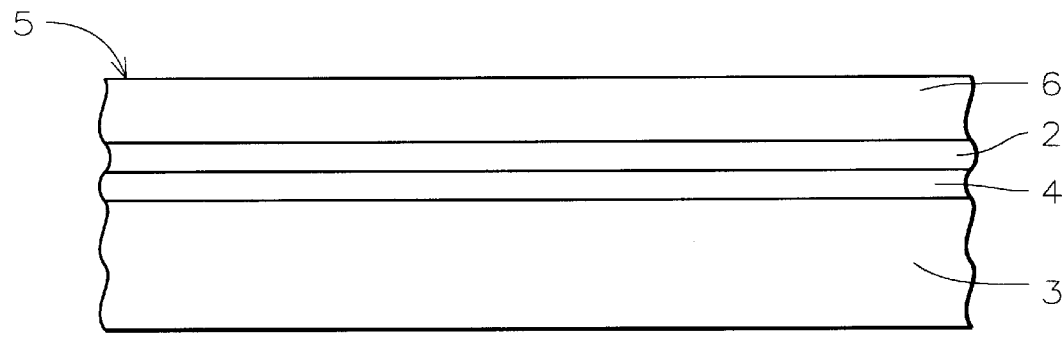
Figure 3:
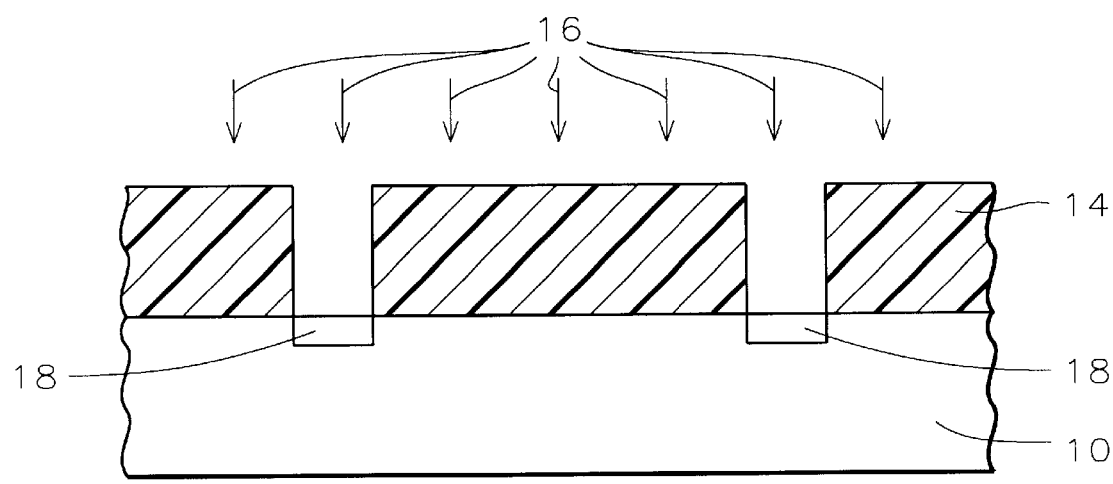
FIGS. 3 through 7 schematically represent in cross-sectional representation a first preferred embodiment of the present invention.

A first preferred embodiment of the present invention wherein the buried layer structure will be formed by ion implantation or chemical diffusion and wherein the device will be formed by bonding and etchback will be described with reference to FIGS. 3 through 7. Referring now more particularly to FIG. 3, there is shown an illustration of a portion of a partially completed integrated circuit in which there is a monocrystalline silicon semiconductor substrate 10. A layer of photoresist is coated over the substrate and patterned to form photoresist mask 14 leaving openings where the buried layer structure is to be formed. For example, Arsenic ions 16 are implanted into the silicon substrate 10 through the openings in the photoresist mask 14 to form buried layer regions 18. N+ regions can be formed by implanting arsenic, antimony or phosphorus ions. P+ regions can be formed by implanting boron ions. The ions are implanted with a dosage of between about 1 E 12 to 1 E 14 atoms/cm$^2$ at an energy of between about 30 and 200 KeV wherein the doping profile of the implanted ions peaks at a concentration of between about 1 E 17 to 1 E 20 atoms/cm$^3$.

Figure 4:
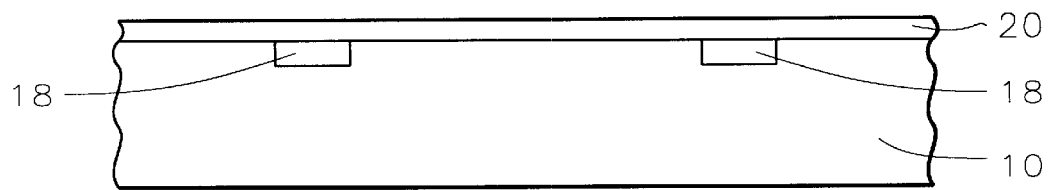

Referring now to FIG. 4, the photoresist mask is removed and the surface of the silicon substrate 10 is thermally oxidized to form a silicon oxide layer 20. This layer is between about 500 to 10,000 Angstroms in thickness.

Figure 5:
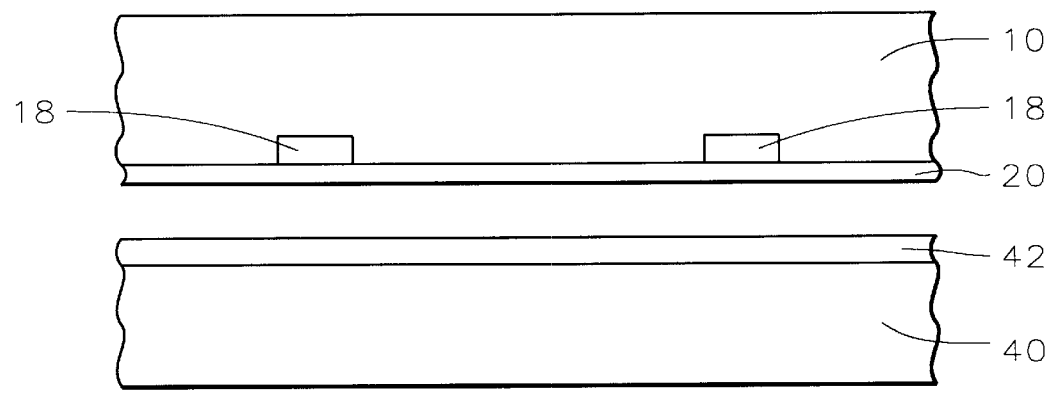

FIG. 5 illustrates a second monocrystalline silicon semiconductor substrate 40 on which a silicon oxide layer 42 has been grown or deposited to a thickness of between 0 and about 10,000 Angstroms. The substrate 10 is turned upside down and the two wafers are joined at their oxide layers 20 and 42. The wafers are bonded together using a method of current practice, for example, by hydrophilic bonding at room temperature.

Figure 6:
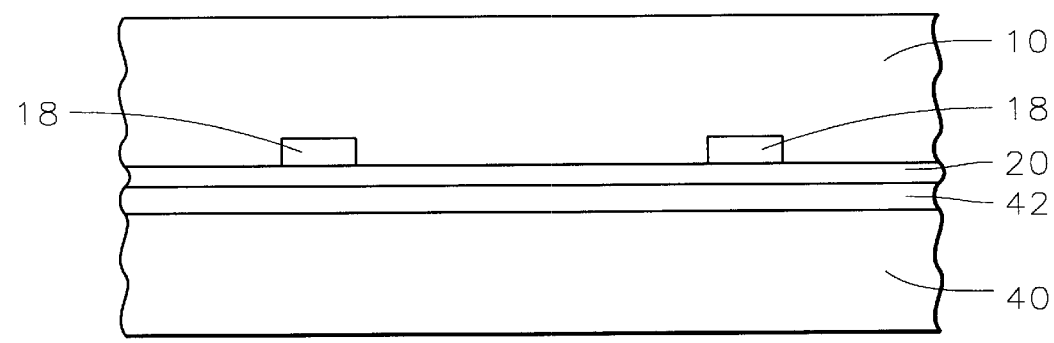
Figure 7:
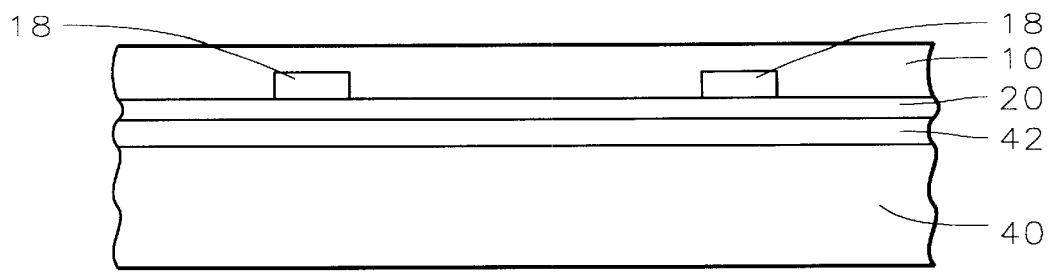

FIG. 6 shows the two substrates bonded together. The bottom surface of the silicon substrate 10 is now etched backed using a chemical or mechanical polishing method, such as chemical mechanical polishing (CMP), or other polishing methods known in the art, for example, high purity alkali solutions with colloidal silica, to leave a thin silicon layer containing the buried regions 18, as shown in FIG. 7. The remaining silicon layer has a typical thickness of between about 500 and 6000 Angstroms.

Figure 8:
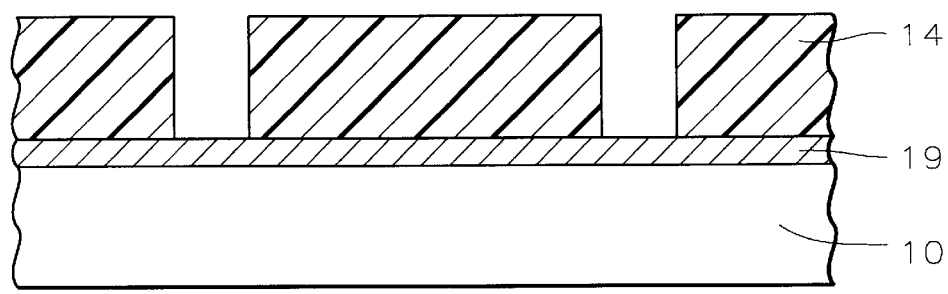
FIGS. 8 through 12 schematically represent in cross-sectional representation a second preferred embodiment of the present invention.

A second preferred embodiment of the present invention wherein the buried layer structure will be formed by a silicide layer will be described with reference to FIGS. 8 through 12. Referring now more particularly to FIG. 8, there is shown an illustration of a portion of a partially completed integrated circuit in which there is a monocrystalline silicon semiconductor substrate 10. A silicide layer 19, such as tungsten silicide, titanium silicide, or molybdenum silicide is deposited over the silicon substrate 10 to a thickness of between about 100 and 1000 Angstroms. The silicide material should be chosen so that it has a lowest binary eutectic temperature which is higher than the later bonding temperature. For example, see *Modular Series on Solid State Devices, Vol. V* by Neudecks & Pierret, Addison-Wesley, Reading, Mass., c. 1988, p. 144, Table 7.1.

Figure 9:

A layer of photoresist is coated over the silicide layer and patterned using conventional photolithography and etching techniques to form a photoresist mask 14. The silicide layer 19 is etched away where it is not covered by the photoresist mask, as shown in FIG. 9. Alternatively, the silicide regions 19 may be deposited selectively on the surface of the substrate.

Figure 10:
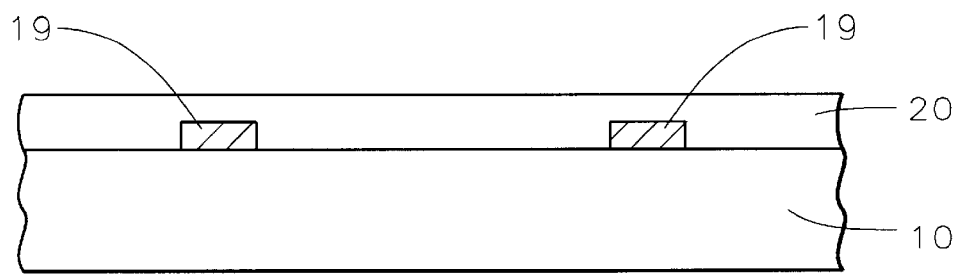

Referring now to FIG. 10, a layer of silicon oxide 20 is deposited over the substrate and covering the silicide regions 19. This layer is between about 500 to 10,1000 Angstroms in thickness.

Figure 11:
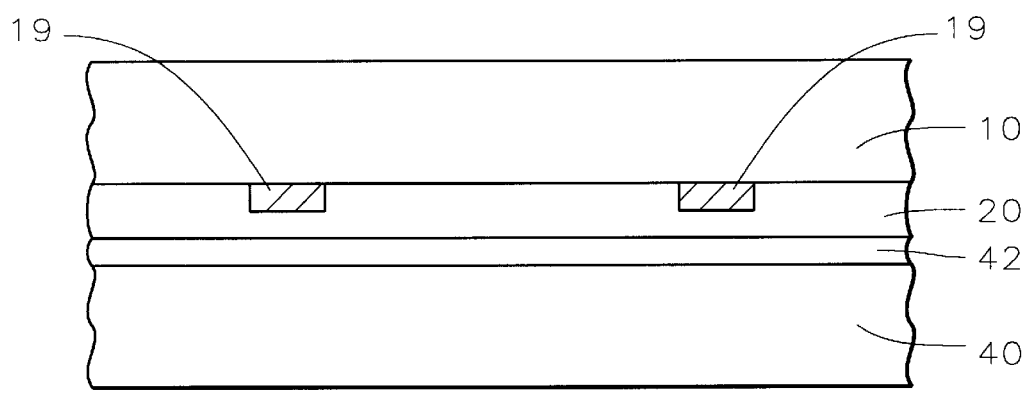

FIG. 11 illustrates a second monocrystalline silicon semiconductor substrate 40 on which a silicon oxide w layer 42 has been grown or deposited to a thickness of between 0 and about 10,000 Angstroms. The substrate 10 is turned upside down and the two wafers are joined at their oxide layers 20 and 42. The wafers are bonded together using a method of current practice, for example, by annealing in an oxygen ambient.

Figure 12:
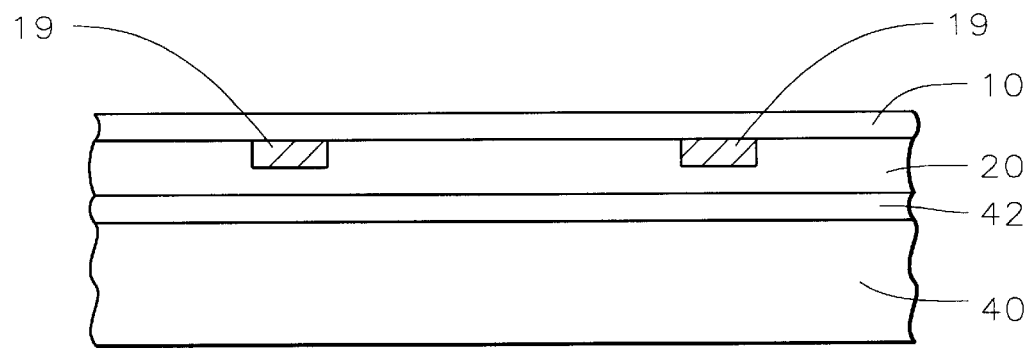

The silicon substrate 10 is now etched back using a chemical or mechanical polishing method, such as several varied versions of CMP methods known in the art, to leave a thin silicon layer containing the buried regions 19, as shown in FIG. 12. The remaining silicon layer has a typical thickness of between about 500 and 6000 Angstroms.

Figure 13:
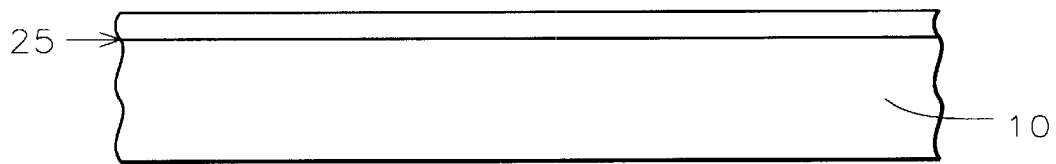
FIGS. 13 through 17 schematically represent in cross-sectional representation a third preferred embodiment of the present invention.

Referring now to FIGS. 13 through 17, a third preferred embodiment of the present invention, wherein the buried layer structure will be formed by ion implantation and bonding will be made by a Unibond™ process, will be described. Referring now more particularly to FIG. 13, there is shown an illustration of a portion of a partially completed integrated circuit in which there is a monocrystalline silicon semiconductor substrate 10. Hydrogen atoms are implanted into the silicon substrate to a depth of between about 1000 and 2000 Angstroms. 25 indicates the level of penetration of the hydrogen atoms and the position at which later wafer splitting will take place.

Figure 14:
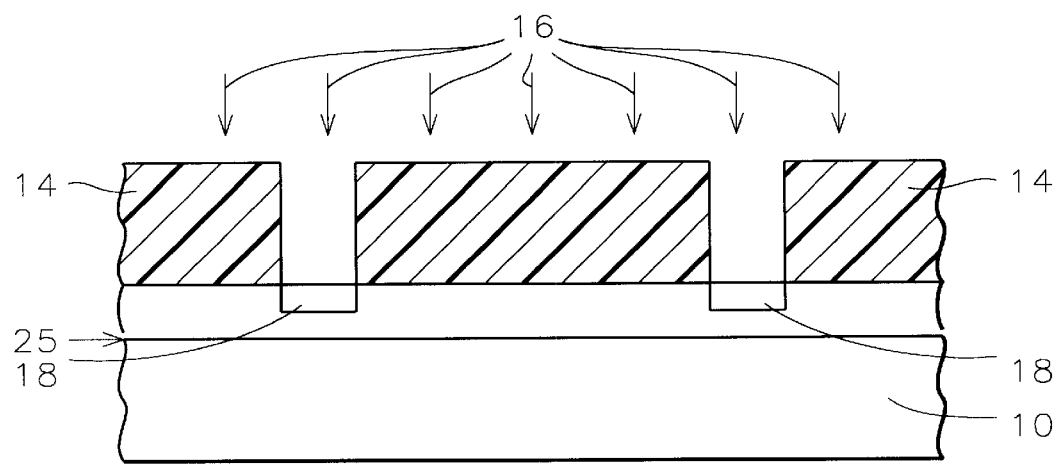

Now, as shown in FIG. 14, a layer of photoresist is coated over the substrate and patterned to form photoresist mask 14 leaving openings where the buried layer structure is to be formed. Ions such as Arsenic ions 16 are implanted into the wafer 10 through the openings in the photoresist mask 14 to form buried layer regions 18.

Figure 15:
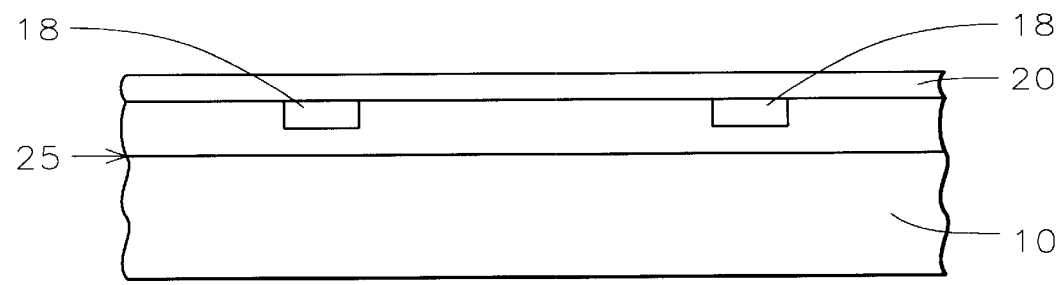

Referring now to FIG. 15, the photoresist mask is removed and a silicon oxide layer 20 is deposited over the surface of the wafer 10 to a typical thickness of between about 1000 to 4000 Angstroms.

Figure 16:
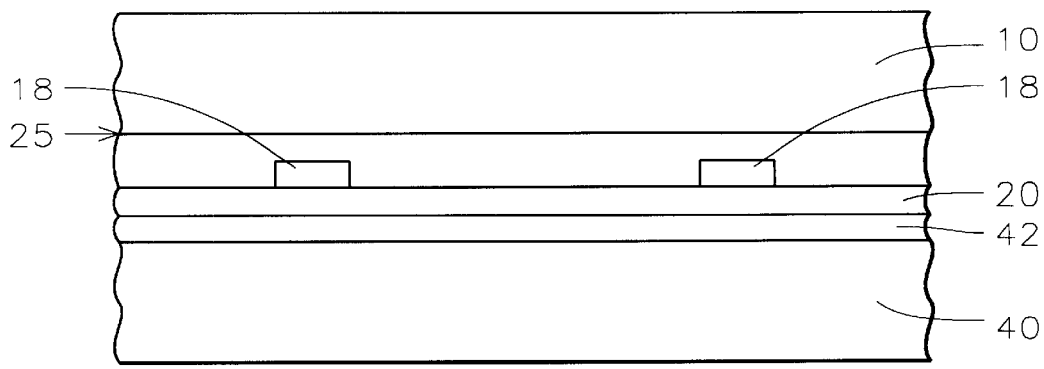

FIG. 16 illustrates a second monocrystalline silicon semiconductor substrate 40 on which a silicon oxide layer 42 has been grown or deposited to a thickness of between 0 and about 4000 Angstroms. The substrate 10 is turned upside down and the two wafers are joined at their oxide layers 20 and 42. The wafers are bonded together using existing methods, for example, by annealing in an oxygen ambient.

Figure 17:
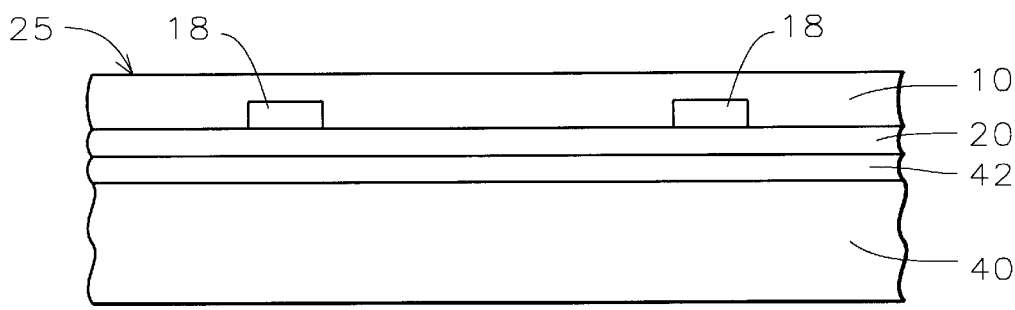

Most of the silicon substrate 10 is now removed by splitting off at level 25 during a heat treatment at between about 400 and 600° C., leaving a small portion of the wafer 10 as the top surface of the resulting wafer, as shown in FIG. 17. A polishing process is then performed to smooth the surface of the resulting wafer. The thickness of the remaining silicon top 10 is typically between about 500 and 2000 Angstroms.

Figure 18:
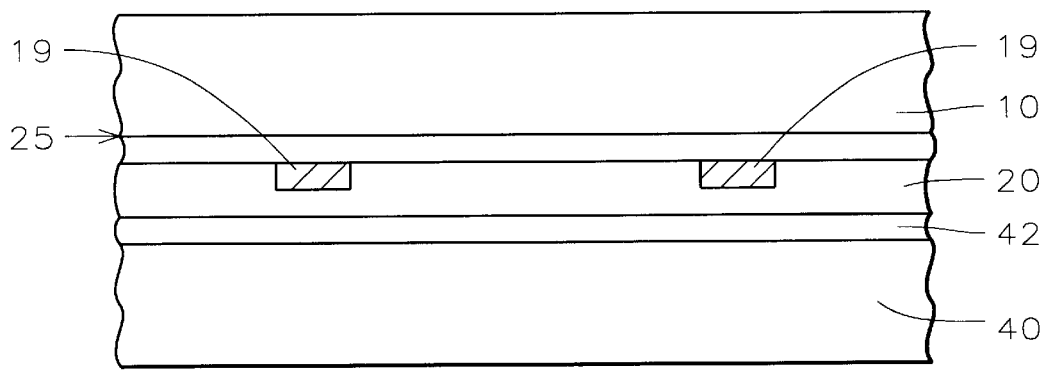
FIGS. 18 and 19 schematically represent in cross-sectional representation a fourth preferred embodiment of the present invention.
Figure 19:
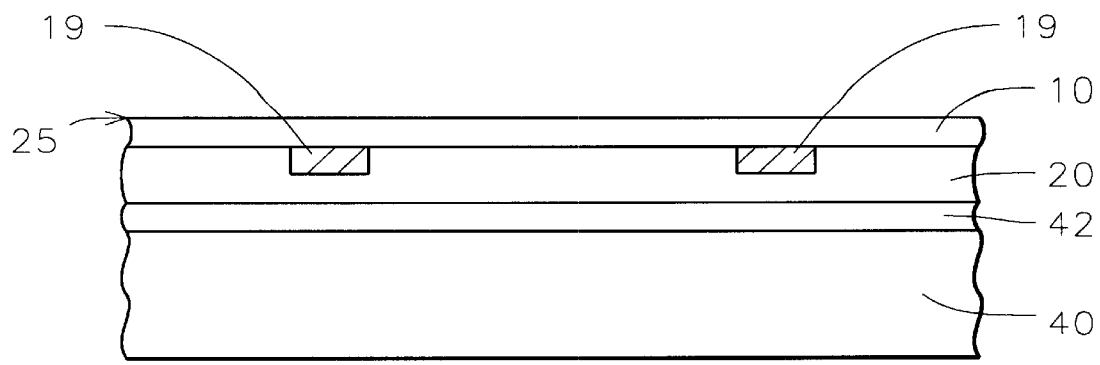

FIGS. 18 and 19 show a fourth embodiment of the invention in which the buried layer structure will be formed by a silicide layer, as in the second invention, and where the SOI device will be formed by a Unibond™ process, as in the third embodiment. First, as in FIG. 13, hydrogen atoms are implanted into the substrate 10 to a depth of between about 1000 and 2000 Angstroms, as indicated by level 25. Then, as in FIG. 8, silicide layer 19, such as tungsten silicide, titanium silicide, or molybdenum silicide is deposited over the monocrystalline silicon substrate 10 to a thickness of between about 100 and 1000 Angstroms. As above, the silicide material should be chosen so that it has a lowest binary eutectic temperature which is higher than the later bonding temperature. A layer of photoresist is coated over the silicide layer and patterned using conventional photolithography and etching techniques to form a photoresist mask 14. The silicide layer 19 is etched away where it is not covered by the photoresist mask, as shown in FIG. 9.

As in FIG. 10, a layer of silicon oxide 20 is deposited over the substrate and covering the silicide regions 19. This layer is between about 1000 and 4000 Angstroms in thickness.

FIG. 18 illustrates a second monocrystalline silicon semiconductor substrate 40 on which a silicon oxide layer 42 has been grown or deposited to a thickness of between 0 and about 4000 Angstroms. The substrate 10 is turned upside down and the two wafers are joined at their oxide layers 20 and 42. The wafers are bonded together using existing practices, for example, by annealing in an oxygen ambient.

Most of the silicon substrate 10 is now removed by splitting off wafer 10 at level 25 during a heat treatment at between about 400 and 600° C., leaving a small portion of the wafer 10 as the top surface of the resulting wafer, as shown in FIG. 19. A polishing process is carried out to smooth the surface of the resulting wafer. The thickness of the remaining silicon top layer is typically between about 500 and 2000 Angstroms.

Figure 20:
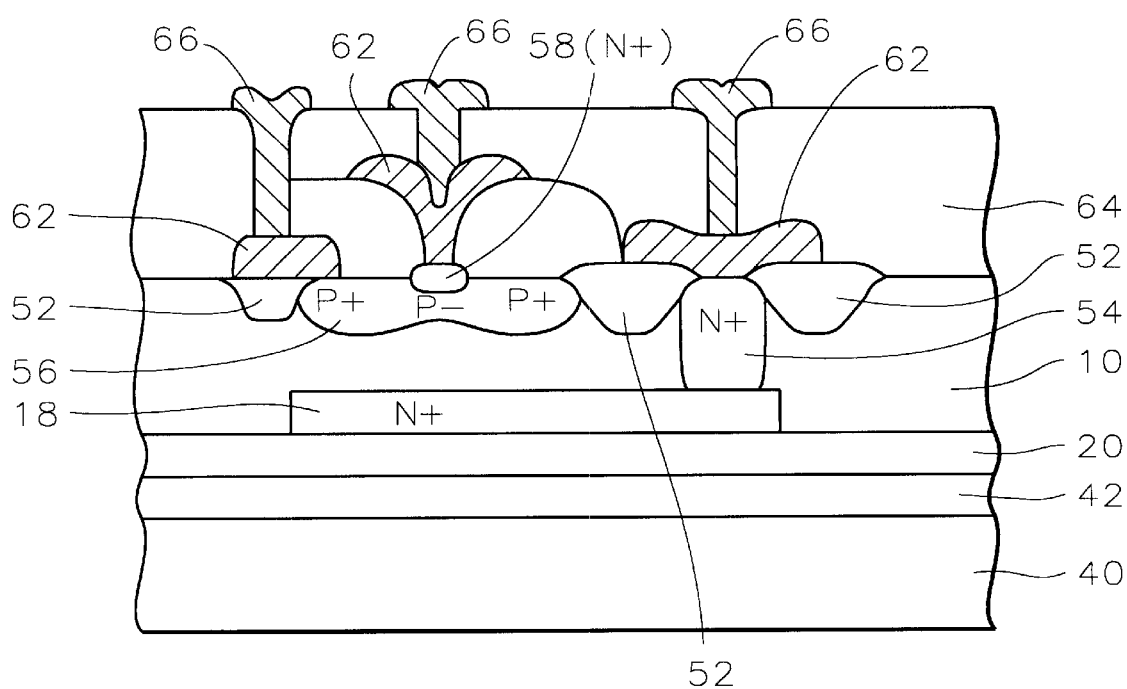
FIG. 20 schematically represents in cross-sectional representation a completed SOI integrated circuit device fabricated by the process of the present invention.

Processing continues as is conventional in the art to form semiconductor device structures and to contact the buried regions with subsequent metallurgy to complete the silicon-on-insulator integrated circuit device. For example, FIG. 20 illustrates an NPN bipolar transistor. Local oxidation of silicon (LOCOS) regions 52 are formed in the silicon substrate 10. An N+ collector plug 54 is formed in the substrate 10 to contact the buried layer 18. P+ base region 56 is formed within the substrate 10. N+ emitter 58 is formed within the base region 56. Polysilicon contacts 62 are formed overlying the substrate in the emitter and collector regions. Metal contacts 66 are formed through the insulating layer 64 to the polysilicon contacts.

FIG. 20 follows FIG. 7 of the first embodiment; however, further processing is similar for all embodiments.

The process of the present invention provides an effective and very manufacturable method for fabricating a silicon-on-insulator wafer with a buried layer which is used for manufacturing high performance bipolar junction transistor (BJT) and BICMOS devices. The buried contact regions can be formed by using ion implantation or by silicide deposition and patterning. The process can be integrated with bonding and etchback or Unibond™ methods of joining wafers.

While the invention has been particularly shown and described with reference to the preferred embodiments thereof, it will be understood by those skilled in the art that various changes in form and details may be made without departing from the spirit and scope of the invention.

What is claimed is:

1. A method of forming an integrated circuit comprising:
   providing a photoresist mask overlying a first semiconductor substrate;
   implanting ions into said first semiconductor substrate where it is not covered by said photoresist mask to form implanted regions;
   forming a first oxide layer overlying said first semiconductor substrate whereby said implanted regions form a buried layer structure;
   forming a second oxide layer overlying a second semiconductor substrate;
   bonding said first and said second oxide layers together to form a wafer;
   etching back said first semiconductor substrate to form the silicon layer of a silicon-on-insulator wafer to complete formation of said silicon-on-insulator wafer having a buried layer structure; and
   thereafter forming semiconductor device structures in and on said silicon layer wherein at least one of said semiconductor device structures contacts said buried layer through an opening in said silicon layer to complete fabrication of said integrated circuit.

2. The method according to claim 1 wherein said step of implanting ions into said first semiconductor substrate comprises implanting ions with a dosage of 1 E 12 to 1 E 14 atoms/cm$^2$ at an energy of between about 30 and 200 KeV.

3. The method according to claim 1 wherein said first oxide layer has a thickness of between about 500 and 10,000 Angstroms.

4. The method according to claim 1 wherein said second oxide layer has a thickness of between 0 and about 10,000 Angstroms.

5. The method according to claim 1 wherein said step of bonding together said first and second oxide layers comprises hydrophilic bonding at room temperature.

6. The method according to claim 1 wherein after said step of etching back said first semiconductor substrate, the thickness of said first semiconductor substrate remaining overlying said buried layer structure is between about 500 and 6000 Angstroms.

7. A method of forming an integrated circuit comprising:
   providing a silicide layer overlying a first semiconductor substrate;
   forming a photoresist mask overlying said silicide layer;
   etching away said silicide layer where it is not covered by said photoresist mask to leave silicide regions overlying said first semiconductor substrate;
   forming a first oxide layer overlying said silicide regions whereby said silicide regions form a buried layer structure;
   forming a second oxide layer overlying a second semiconductor substrate;
   bonding said first and said second oxide layers together to form a wafer;
   etching back said first semiconductor substrate to form the silicon layer of a silicon-on-insulator wafer to complete formation of a silicon-on-insulator wafer having a buried layer structure;
   thereafter forming a conductive plug through an opening in said silicon layer to said buried layer; and
   forming a contact overlying said silicon layer to said conductive plug to complete said integrated circuit.

8. The method according to claim 7 wherein said silicide layer comprises tungsten silicide.

9. The method according to claim 7 wherein said silicide layer comprises titanium silicide.

10. The method according to claim 7 wherein said silicide layer comprises molybdenum silicide.

11. The method according to claim 7 wherein said silicide layer has a thickness of between about 100 and 1000 Angstroms.

12. The method according to claim 7 wherein said first oxide layer has a thickness of between about 500 and 10,000 Angstroms.

13. The method according to claim 7 wherein said second oxide layer has a thickness of between 0 and about 10,000 Angstroms.

14. The method according to claim 7 wherein said step of bonding together said first and second oxide layers comprises hydrophilic bonding at room temperature.

15. The method according to claim 7 wherein after said step of etching back said first semiconductor substrate, the thickness of said first semiconductor substrate remaining overlying said buried layer structure is between about 500 and 6000 Angstroms.

16. A method of forming a bipolar integrated circuit comprising:

implanting hydrogen atoms into a first semiconductor substrate to form a wafer split level within said first semiconductor substrate;

forming a photoresist mask overlying said first semiconductor substrate;

implanting ions into said first semiconductor substrate where it is not covered by said photoresist mask to form implanted regions;

forming a first oxide layer overlying said first semiconductor substrate whereby said implanted regions form a buried layer structure;

forming a second oxide layer overlying a second semiconductor substrate;

bonding said first and said second oxide layers together to form a wafer;

removing most of said first semiconductor substrate at said wafer split level;

polishing said first semiconductor substrate remaining to form the silicon layer of a silicon-on-insulator wafer to complete formation of a silicon-on-insulator wafer having said buried layer structure;

thereafter forming a collector plug through an opening in said silicon layer to said buried layer;

forming a base region within said silicon layer;

forming an emitter within said base region;

forming first contacts overlying said silicon layer contacting said emitter and said collector; and forming second contacts through an insulating layer to said first contacts to complete said bipolar integrated circuit.

17. The method according to claim 16 wherein said first semiconductor substrate remaining has a thickness of between about 500 and 2000 Angstroms.

18. The method according to claim 16 wherein said step of implanting ions into said first semiconductor substrate comprises implanting ions with a dosage of 1 E 12 to 1 E 14 atoms/cm$^2$ at an energy of between about 30 and 200 KeV.

19. The method according to claim 16 wherein said first oxide layer has a thickness of between about 1000 and 4000 Angstroms.

20. The method according to claim 16 wherein said second oxide layer has a thickness of between 0 and about 4000 Angstroms.

21. The method according to claim 16 wherein said step of bonding together said first and second oxide layers comprises hydrophilic bonding at room temperature.

22. A method of forming a silicon-on-insulator wafer having a buried layer structure in the fabrication of an integrated circuit comprising:

planting a wafer split level within a first semiconductor substrate using hydrogen atom implantation;

depositing a silicide layer overlying said first semiconductor substrate;

forming a photoresist mask overlying said silicide layer;

etching away said silicide layer where it is not covered by said photoresist mask to leave silicide regions overlying said first semiconductor substrate;

forming a first oxide layer overlying said first semiconductor substrate and said silicide regions whereby said silicide regions form said buried layer structure;

forming a second oxide layer overlying a second semiconductor substrate;

bonding said first and said second oxide layers together to form said wafer;

removing most of said first semiconductor substrate by splitting the wafer at said wafer split level formed by said hydrogen atom implantation;

polishing said first semiconductor substrate remaining to complete said formation of said silicon-on-insulator wafer having said buried layer structure; and thereafter forming semiconductor device structures in and on said first semiconductor substrate wherein at least one of said semiconductor device structures contacts said buried layer through an opening in said first semiconductor substrate to complete fabrication of said integrated circuit.

23. The method according to claim 22 wherein said first semiconductor substrate remaining has a thickness of between about 500 and 2000 Angstroms.

24. The method according to claim 22 wherein said silicide layer comprises one of the group containing tungsten silicide, titanium silicide, and molybdenum silicide.

25. The method according to claim 22 wherein said silicide layer has a thickness of between about 100 and 1000 Angstroms.

26. The method according to claim 22 wherein said first oxide layer has a thickness of between about 1000 and 4000 Angstroms.

27. The method according to claim 22 wherein said second oxide layer has a thickness of between 0 and about 4000 Angstroms.

28. The method according to claim 22 wherein said step of bonding together said first and second oxide layers comprises hydrophilic bonding at room temperature.

* * * * *